United States Patent [19]

Berthozat et al.

[11] Patent Number: 5,544,111
[45] Date of Patent: Aug. 6, 1996

[54] PROGRAMMING PROCESS FOR INTEGRATED MEMORY, PARTICULARLY FOR A SMART CARD

[75] Inventors: Michel Berthozat, Les Miles; Paul Morgavi, Marseille, both of France

[73] Assignee: Gemplus Card International, Gemenos, France

[21] Appl. No.: 108,740

[22] PCT Filed: Mar. 14, 1991

[86] PCT No.: PCT/FR92/00216

§ 371 Date: Aug. 31, 1993

§ 102(e) Date: Aug. 31, 1993

[87] PCT Pub. No.: WO92/16947

PCT Pub. Date: Oct. 1, 1992

[30] Foreign Application Priority Data

Mar. 14, 1991 [FR] France .................. 91 03106

[51] Int. Cl.$^6$ .................................................. G11C 17/00
[52] U.S. Cl. .................... 365/225.7; 365/96; 235/380
[58] Field of Search ............... 365/96, 104, 225.7; 235/380

[56] References Cited

U.S. PATENT DOCUMENTS

| | | | |
|---|---|---|---|
| 3,835,458 | 9/1974 | Mrazek | 365/94 |
| 3,976,983 | 8/1976 | Moussie | 365/96 |
| 4,480,318 | 10/1984 | Chong | 365/104 |
| 4,592,025 | 5/1986 | Takemae et al. | 365/200 |
| 4,933,898 | 6/1990 | Gilberg et al. | 365/225.7 X |
| 4,937,465 | 6/1990 | Johnson et al. | 307/202.1 |
| 5,291,434 | 3/1994 | Kowalski | 365/96 |

FOREIGN PATENT DOCUMENTS 0149402  12/1984  European Pat. Off. .

OTHER PUBLICATIONS

Recherch, LA, M. Ugon et al:'Les Cartes à puce', Apr. 1986, pp. 470–479.
Paul Franklin and David Burgess, "Reliability Aspects of Nichrome Fusible Link PROM's", Apr. 2, 1974, pp. 82–86.
L. Renoux,"Deux Tendancesen Programmation des PROM: Universalité et emploi avec PC", Feb. 1, 1986, pp. 60–65.

*Primary Examiner*—Joseph A. Popek
*Attorney, Agent, or Firm*—Roland Plottel

[57] ABSTRACT

Process for programming memories of the fuse protection type, particularly those used in smart or chip cards. A breakdown voltage is applied (204) for a time greatly exceeding that used in the prior art, and with a current at a value well above that used in the prior art. Typically 100 ms and 2A are used. Programmable processors (102) make it possible to regulate these values and carry out tests beforehand. These methods avoid reconstitution of blown fuses and the errors resulting therefrom.

11 Claims, 1 Drawing Sheet

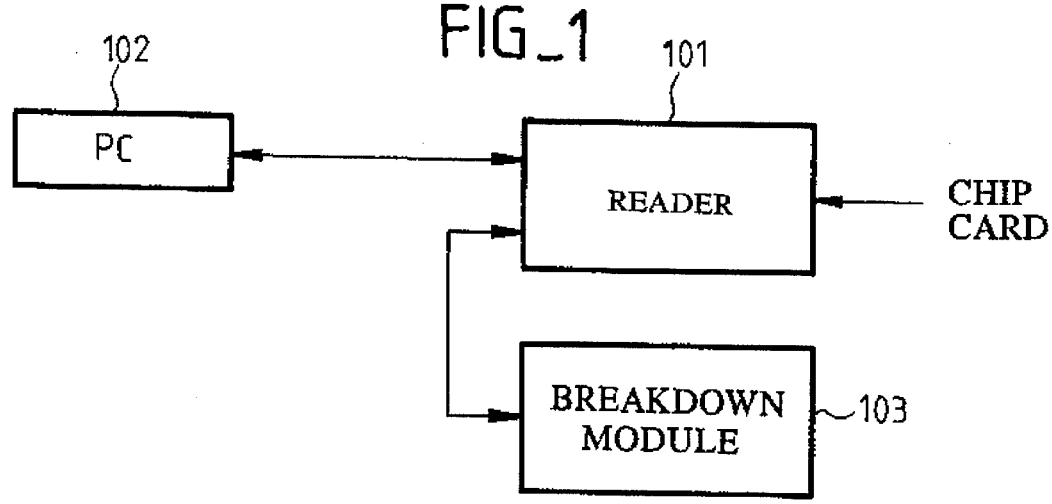
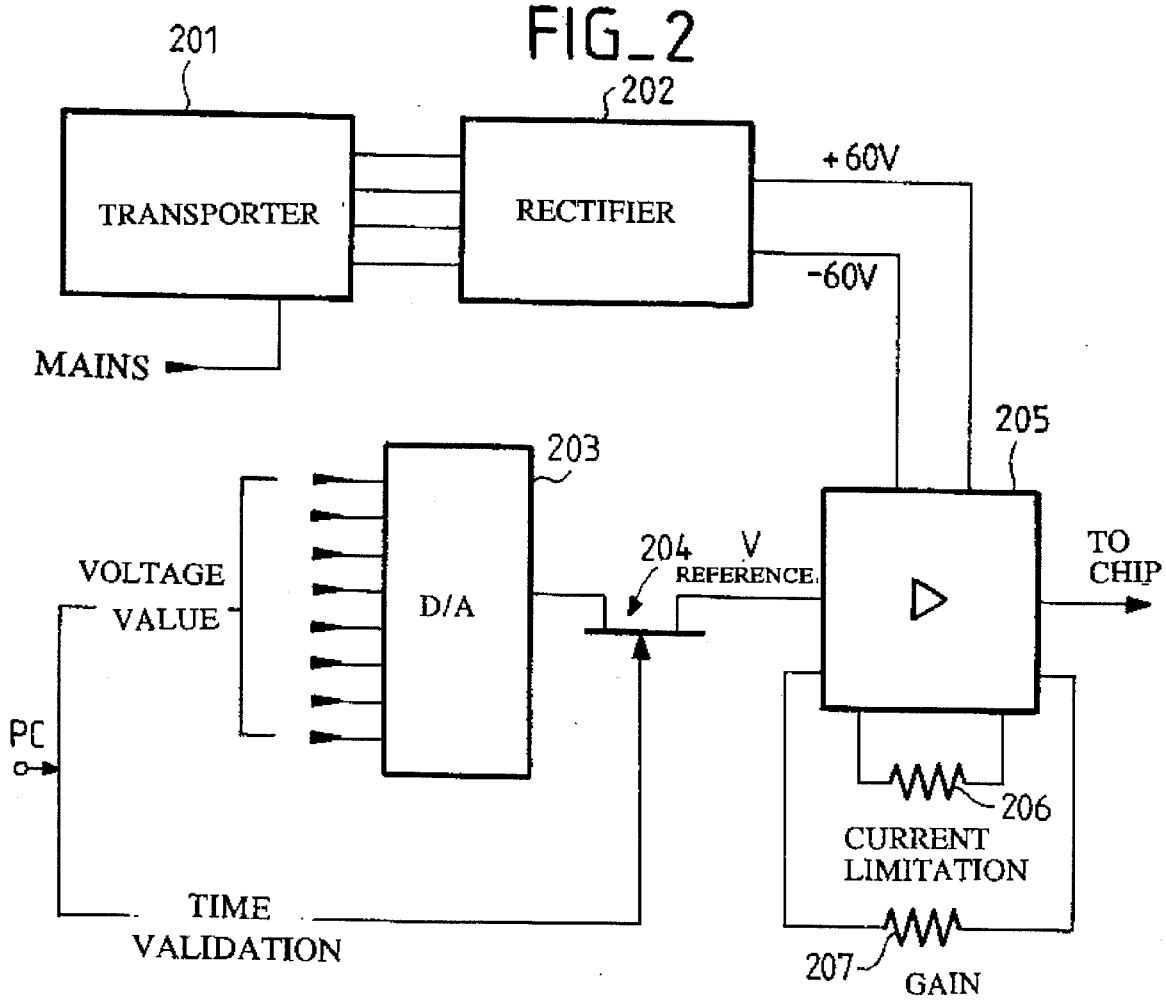

PROGRAMMING PROCESS FOR INTEGRATED MEMORY, PARTICULARLY FOR A SMART CARD

BACKGROUND OF THE INVENTION

1. Field of the Invention

The present invention relates to processes making it possible to program integrated memories, particularly those provided for smart cards, for recording therein binary data of various types.

2. Description of the Prior Art

Smart cards, also known as chip cards, are cards of the same size as a credit card and in which is inserted at least one integrated circuit having a memory and logic processing circuits which can optionally constitute a microprocessor. At least part of the memory is programmed in order to form a read-only memory (ROM), so as to e.g. be able to personalize the card. For this purpose the memory is programmed and then a fuse is blown, which makes it possible to prevent any writing in the thus programmed area. Thus, said area can be read, but cannot be reprogrammed. In principle, the blowing action of a fuse leads to a very reliable protection, because normally a fuse is not reconstituted. However, in practice, although it is not reconstituted, the blown fuse returns to a relatively conductive state, which can then permit the reprogramming of the normally protected area. The reason for this is not known and it is believed that particles of conductive elements reconstitute over a longer or shorter term the destroyed connection, as a result of the minute dimensions of said connection. As a result of the very small dimensions, for the purpose of blowing the fuses, the breakdown voltage is only applied for a short time of between 5 and 10 ms and the maximum intensity of the breakdown current is limited to approximately 30 mA, so as not to risk damaging the connections adjacent to that which has been blown.

The devices known at present for blowing fuses are very simple and are essentially dedicated to one circuit type. Therefore they do not make it possible to modify the breakdown voltage to be applied to the circuit or the time during which said voltage is applied. Moreover, in order to respect the limits given above, the current supplied is low. Finally, the breakdown is not systematically verified.

SUMMARY OF THE INVENTION

In order to obtain a reliable programming of smart cards, the invention proposes a process for programming an integrated memory of the fuse-protected type, in which for a predetermined time a breakdown voltage is applied to a fuse corresponding to a current limited to a given intensity and which is mainly characterized in that said intensity is at least equal to 1 ampere.

BRIEF DESCRIPTION OF THE DRAWINGS

The invention is described in greater detail hereinafter relative to a non-limitative embodiment and with reference to the attached drawings, wherein show:

FIG. 1 a general diagram of the programming and protection means according to the invention.

FIG. 2 a diagram of the breakdown voltage generating device.

DETAILED DESCRIPTION OF THE INVENTION

In FIG. 1, a smart card reader 101 in accordance with ISO Standard 7816-3 is connected to a control member 102, e.g. of the personal computer (PC) type and to a breakdown module 103, which supplies the fuse breakdown voltages. For this purpose, the reader comprises interface circuits, which make it possible to control the module 103 from the PC 102 and apply the voltage obtained to the interface, which is in itself known from the reader with the card. These interface circuits have connections and logic circuits assembled in accordance with standard procedures. They facilitate the connection to the PC and it would be possible to use a direct connection thereto, but this would have the disadvantage of requiring a supplementary output on the PC, which is more expensive than the interface integrated into the reader.

The diagram of the breakdown module is shown in FIG. 2. A transformer 201, supplied from the mains, is connected to a rectifying circuit 202 in order to obtain two d.c. voltages + and −60 V. At present, these are the extreme voltages necessary, according to the invention, for the blowing of the fuses of fuse-protected memories. If in the future it proved necessary to use higher voltages, they could be obtained without difficulty.

The value of the voltage to be used (dependent on the memory type) comes from the PC, via the reader 101, in the form of a binary word, which is applied to a digital-analog converter 203, which supplies the reference voltage chosen by the PC to a transistor switch 204.

This transistor switch 204 is switched off for the necessary time by a time validation pulse applied to its gate. This pulse comes from the reader 101, in which it has been calibrated e.g. from another binary word supplied by the PC.

As neither the converter, nor the transistor switch can supply the necessary intensity, the reference voltage is applied to a power amplifier 205, supplied by the rectifier 202. This amplifier then supplies the desired breakdown pulse to the smart card, via the reader 101. The output resistance of this amplifier is e.g. below 1 ohm and the amplifier is provided with current limiting means, e.g. an external rheostat 206. In addition, if the reference voltage is only equal to a fraction of the breakdown voltage, e.g. due to the limitations of the converter 203, the amplifier 205 is provided with means for regulating its gain, e.g. an external resistor 207. All these means are known per se.

According to the invention the limitation of the breakdown current and optionally the duration of the pulse are well above the maximum values used at present. Typically, the current is limited to 2A and the voltage is applied for 1 to 100 ms, preferably 30 to 100 ms. Thus, there is a completely irreversible breakdown or blowing of the fuses, without leading to any damage in cells adjacent to the fuse which has blown, unlike the fears which up to now had led to the limitations of the prior art. This current of 2A is generally obtained with a voltage of 50 V, which is within the range provided hereinbefore.

The addressing programs of the memory cells and the all or nothing control programs of the breakdown are known and it is merely sufficient to supplement the binary word controlling the breakdown by a sufficient number of bits, or optionally by other binary words, in order to determine the duration and voltage of the breakdown pulse used. This represents no difficulty for the Expert, because he already knows the previously used breakdown program.

In addition, the program could be completed by instructions making it possible to read the content of the memory following its programming, which is easy because the reader 101 permits such a reading to take place, controlled by the PC 102.

The current and time values indicated hereinbefore are standard values for the presently used memories.

Bearing in mind the different memory models and the evolution of technology, it is of interest to be able to carry out tests in order to determine optimum values corresponding to a particular existing or future memory type. For this purpose, according to the invention, the PC 102 is programmed in order to blow in one or more test smart cards a sufficiently significant number of fuses, with differing voltages and times extending above and below the values given hereinbefore. For example, a dozen fuses will be blown with varied voltage/time pairs.

Once the memory is protected in this way, its content is written/read (as in a memory test), still by the programming of PC 102, so as to check that the blown fuses have indeed been blown, that the informations recorded in the protected area have not been disturbed by the operation and that the unprotected areas have suffered no deterioration. This writing/reading operation is repeated several times at intervals of a few days in order to check the stability of the blowing operations. Finally, the voltage and time values are chosen, which are most suitable as a function of the results obtained.

It is in fact this method which has led the Inventors to the values described hereinbefore and which are suitable in the cases most frequently occurring at present.

What is claimed is:

1. A process for programming a portion of an integrated circuit memory, comprising the steps of writing a program in a portion of memory in an area thereof, blowing a fuse in the memory thus preventing any further writing in said area, said blowing of a fuse including applying a current of at least 1 ampere and placing said integrated circuit in a smart card, thereby making said smart card more secure from tampering.

2. A process according to claim 1, wherein the given time (204) is at least equal to 30 ms.

3. A process according to claim 1, wherein the intensity (206) is substantially equal to 2 amperes.

4. A process according to claim 1, wherein the given time (204) is substantially equal to 100 ms.

5. A process according to claim 1, wherein use is made of a computer (102) for controlling the time and voltage of the breakdown pulse.

6. A process according to claim 5, wherein the blowing of the fuse is checked by writing/reading the memory with the aid of the computer (102).

7. A process according to claim 6, wherein an optimum voltage/time pair (203,204) for the pulse is determined for a given fuse model by blowing a group of fuses with variable voltage/time pairs and by checking-by time-spread writing/reading operations that the informations entered in the protected area are still present and protected therein.

8. The process of claim 1 wherein said current is applied for a time between 10 and 100 milliseconds.

9. The process of claim 1 wherein said current is applied for a time between 30 and 100 milliseconds with the current in the range of 1 to 2 amperes.

10. The process of claims 8 or 9, wherein said current is applied with a voltage of at least 50 volts.

11. A process for programming a portion of an integrated circuit memory, comprising the steps of writing a program in a portion of memory, in an area thereof, blowing a fuse in the memory thus preventing any further writing in said area, said blowing of a fuse, including applying a current of at least 1 ampere, with a voltage of at least 50 volts, for a time duration of at least 30 to 100 milliseconds, and placing said integrated circuit in a smart card, whereby said blown fuse, remains blown and does not return to its relatively conductive state, and thus barring reprogramming of said portion of the integrated circuit memory.

* * * * *